United States Patent [19]

Latour

[11] 4,004,119

[45] Jan. 18, 1977

[54] ELECTRICAL SWITCH ASSEMBLY FOR A PRINTED CIRCUIT BOARD

[75] Inventor: Marc Rene Latour, Garner, N.C.

[73] Assignee: International Telephone and Telegraph Corporation, Nutley, N.J.

[22] Filed: Aug. 20, 1975

[21] Appl. No.: 606,278

[52] U.S. Cl. .............................. 200/158; 339/17 R
[51] Int. Cl.² ........................................ H01H 19/28
[58] Field of Search ........ 200/158; 339/17 R, 17 C, 339/17 LC; 317/101 CE, 101 CC

[56] References Cited

UNITED STATES PATENTS

| | | | |
|---|---|---|---|
| 2,854,552 | 9/1958 | Gouverneur | 339/17 R |
| 3,524,960 | 8/1970 | Lohff | 200/158 UX |

Primary Examiner—Herman Hohauser
Attorney, Agent, or Firm—John T. O'Halloran; Alfred C. Hill

[57] ABSTRACT

A predetermined pattern of a plurality of conductors are disposed on one surface of a dielectric substrate, a given number of the plurality of conductors each having a gap therein. A dielectric switch block is disposed adjacent one surface of the substrate. A plurality of screws are each disposed adjacent a different one of the gaps and extend into the switch block. Each of the screws have a head thereon that makes and breaks a connection across an associated one of the gaps when the associated one of the screws is screwed in and out of the block.

9 Claims, 7 Drawing Figures

ELECTRICAL SWITCH ASSEMBLY FOR A PRINTED CIRCUIT BOARD

BACKGROUND OF THE INVENTION

This invention relates to printed circuit boards and more particularly to an electrical switch assembly therefore.

It is known that printed circuit boards have a predetermined pattern of conductors disposed on one surface of the dielectric substrate with the conductors having apertures therein in registry with apertures in the substrate through which terminals from electrical components can be inserted from the other surface of the dielectric substrated and soldered to the conductors to provide a desired circuit, such as an oscillator, amplifier, or the like. It is also known that certain conductors and certain additional components can be provided in association with an electrical switch assembly wherein the assembly may be associated with the primary circuit so as to facilitate adding or removing components from the electronic circuit involved and to change the configuration of the circuit, such as a parallel circuit to a series circuit so as to change the operating characteristics of the circuit, such as the operating frequency, the characteristic impedance or the like.

The prior art electrical switch assemblies employed in the manner described above have been large, thereby employing valuable board space, expensive, bulky, lack variation of usage and at times difficult to assemble.

SUMMARY OF THE INVENTION

An object of the present invention is to provide an electrical switch assembly for a printed circuit board that is ultra-small, easy to assemble and useable several ways.

Another object of the present invention is to provide an electrical switch assembly for a printed circuit board that when assembled, the unit becomes a miniature cluster of switches capable of being actuated with a small screw driver.

A further object of the present invention is the provision of an electrical switch assembly for a printed circuit board enabling random placement of this assembly due to its small size.

Still another object of the present invention is to provide an electrical switch assembly for a printed circuit board that is capable of being employed in two different ways.

A feature of the present invention is the provision of an electrical switch assembly for a printed circuit board comprising; a printed circuit board including a dielectric substrate, and a predetermined pattern of a plurality of conductors disposed on one surface of the substrate, a given number of the plurality of conductors each having a gap therein; a dielectric switch block disposed on the other surface of the substrate; and a plurality of screws each disposed adjacent a different one of said gaps and extending into the block, each of the plurality of screws having a head thereon that makes and breaks a connection across an associated one of the gaps when each of the plurality of screws is screwed in and out of the block.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
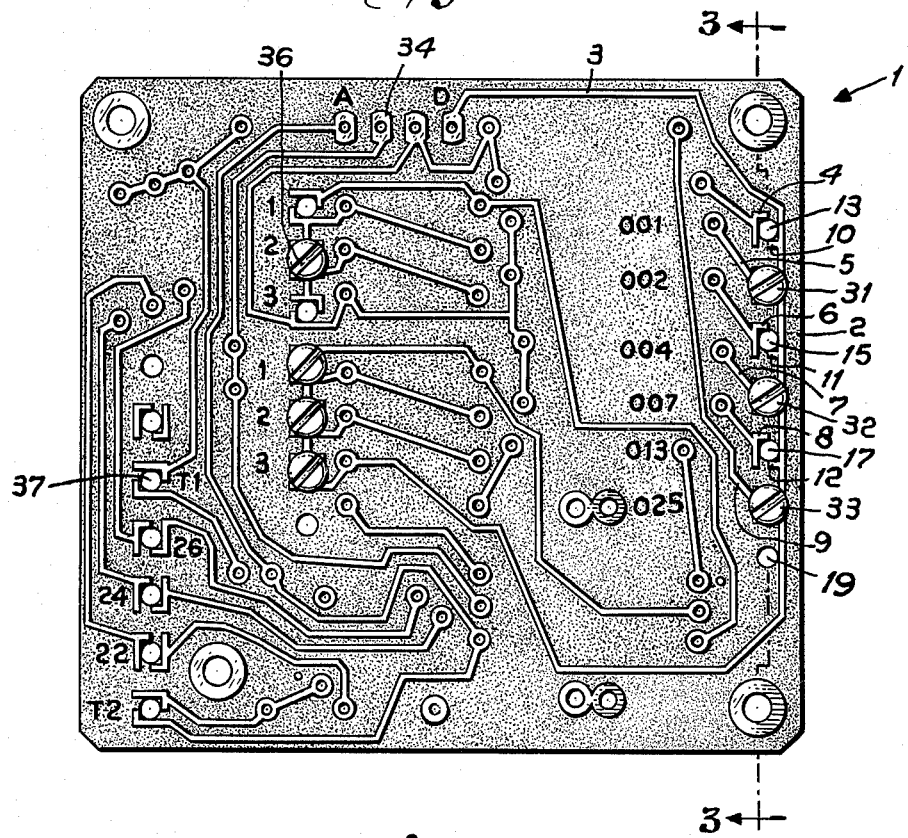
FIG. 1 is a plan view of the conductor surface of a printed circuit board incorporating the electrical switch assembly in accordance with the principles of the present invention.
Figure 2:
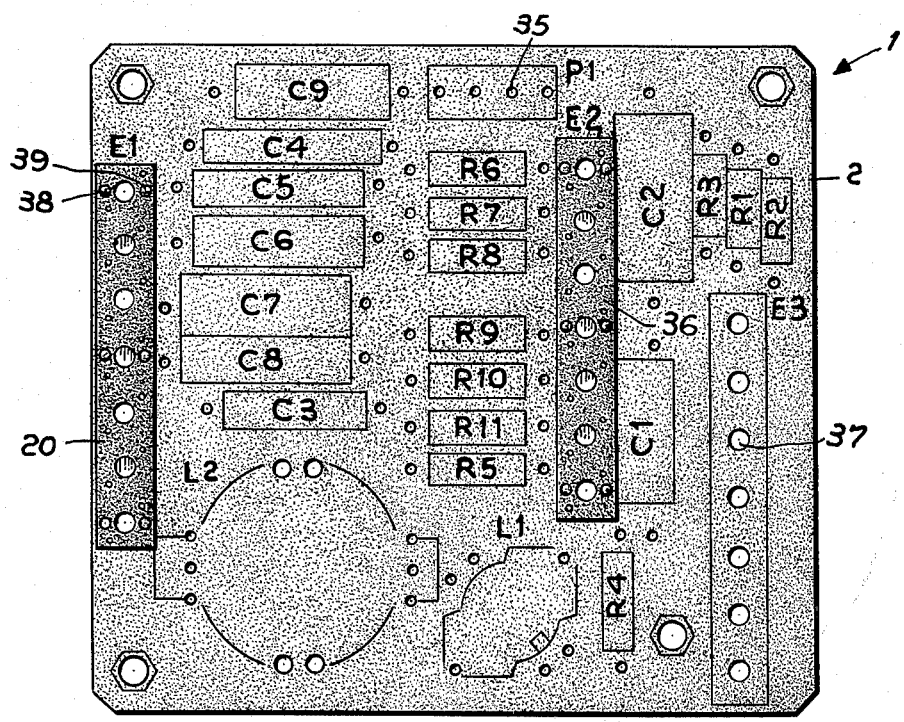
FIG. 2 is a plan view of the component surface of the printed circuit board of FIG. 1 with the components removed, but containing indices illustrating the position and type of the components.
Figure 3:
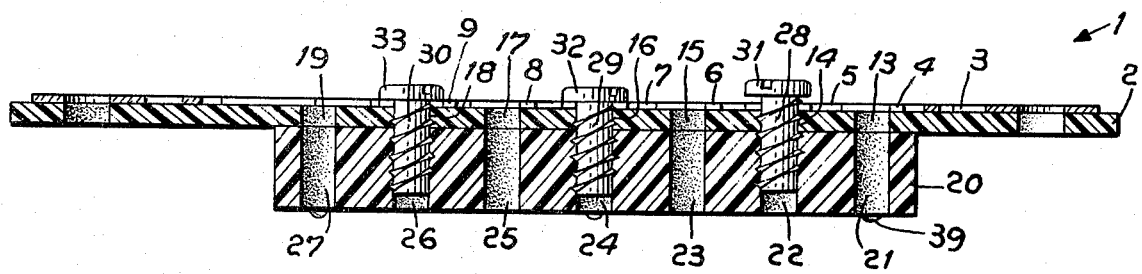
FIG. 3 is a cross-sectional view taken along line 3—3 of FIG. 1.

Referring to FIGS. 1, 2 and 3, there is illustrated therein a printed circuit board 1 incorporating the electrical switch assembly of the present invention. Printed circuit board 1 includes a dielectric substrate 2 having on one surface thereof a predetermined pattern of a plurality of conductors 3, a given number of which, such as conductors 4 to 9, have gaps therein such as illustrated at 10, 11 and 12.

A plurality of first apertures 13 to 19 extend through the substrate in different ones of the gaps contained in the conductors 4–9. A dielectric switch block 20 is disposed on the other surface, of substrate 2 and includes at least a plurality of second apertures 21–27 in registry with the first apertures 13–19. Screws 28–30 extend through a different one of selected ones of the plurality of first apertures 13 to 19 and are threaded into registered ones of the plurality of second apertures; namely, apertures 22, 24 and 26. The screws 28–30 each includes heads 31–33 which makes and breaks a connection across the gaps associated with conductors 5, 7 and 9 when the screws 31–33 are screwed in and out of apertures 22, 24 and 26 and apertures 14, 16 and 18. Screws 29 and 30 are shown in a "make" contact position and screw 28 is shown in a "break" contact position.

As can be seen in FIG. 1, the predetermined pattern of conductors have apertures therein, such as aperture 34, in registry with an aperture 35 in substrate 2. These registered apertures enable components to be connected to conductors 3 in a desired circuit configuration by extending the terminals of these components from the other surface of substrate 2 through to conductors 3 and soldered thereto. With the switching arrangement just discussed hereinabove including the screws 28–30, and the switch block 20, it is possible to insert or remove components so as to change the response and/or configuration of the circuit as mentioned hereinabove under the heading "Background of the Invention". Due to the small size of the electrical switch assembly of the present invention, it is possible to randomly place this assembly or to place several assemblies on the printed circuit board 1, such as illustrated at 36, with provisions being made of a third switch assembly on printed circuit board 1 at 37.

Switch block 20 also includes adjacent apertures 21–27, smaller apertures 38 and 39. While these apertures are not employed in the switch assembly as illustrated in FIGS. 1, 2 and 3, they are employed as will be discussed hereinbelow with respect to FIGS. 4–7.

Apertures 21–27 may be threaded to receive screws 28–30. However, it is preferred that the inner wall of apertures 21–27 be smooth and that the screws 28–30 be self-tapping screws, which form their own threads in the apertures 21–27.

The material selected for block 20 is made of glass filled nylon and has a useable temperature range of −50° C to 100° C. The dielectric strength is above 1200 volts and the switch assembly is capable of over 100 reliable operations. The screws 28–30 are made of stainless steel so that in the manner of employing the switch assembly as shown in FIGS. 1, 2 and 3, solder does not adhere to the screws enabling the printed circuit board to be solder dipped without the need of covering the screws, thereby simplifying the assembly of the entire printed circuit board.

Figure 4:
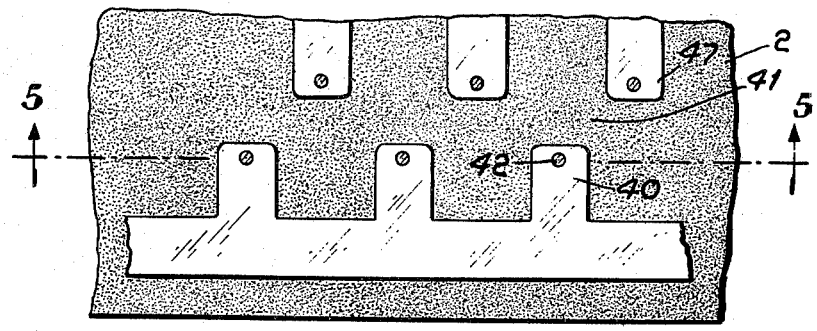
FIG. 4 is a partial plan view of the conductor surface of a printed circuit board in which the electrical switch assembly of FIGS. 1-3 may be employed in a second way with the electrical switch assembly itself removed.
Figure 5:
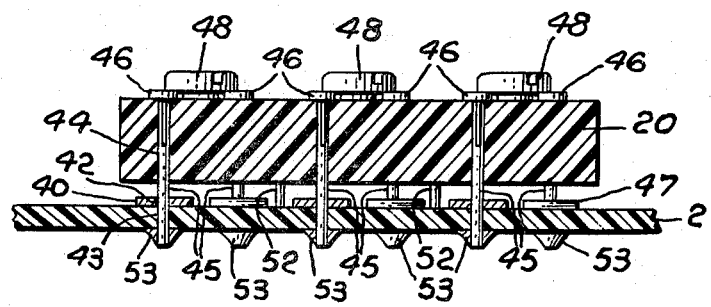
FIG. 5 is a cross-sectional view of FIG. 4 taken along line 5—5 with the electrical switch assembly in accordance with the principles of the present invention in place.

Referring to FIGS. 4 and 5, substrate 2 has formed thereon, as in the case of FIG. 1, a predetermined pattern of conductors, given ones of which contain gaps, such as conductor 40 and gap 41. Conductor 40 has disposed adjacent both sides of gap 41 an aperture 42 which is in registry with an aperture 43 in substrate 2 which in turn is in registry with aperture 44 in block 20, corresponding to aperture 38 of FIG. 2. A pin 45 having a head 46 extends through the registered apertures 42–44. A similar arrangement is disposed on the other side of gap 41 at point 47.

As in the arrangement of FIGS. 1, 2 and 3, a screw having a head 48 thereon is screwed into an aperture of block 20 (not shown). In this arrangement, the make and break connections are provided between the head of screw 48 and the heads 46 of pins 45. Due to pins 45 extending beyond substrate 2, these pins may be used as terminals to which the terminals of the electronic components may be connected. Block 20 has formed integral therewith feet 52 which contact substrate 2 to space block 20 from conductors 4. This provides clearance from the circuit, allows for cleaning and flux removal and provides a means to orient block 20 with substrate 2 automatically. In addition, feet 52 cooperates with solder 53 on the ends of pins 45 engaging the bottom of substrate 2 to hold block 20 and the components thereof in place.

Figures 6, 7:
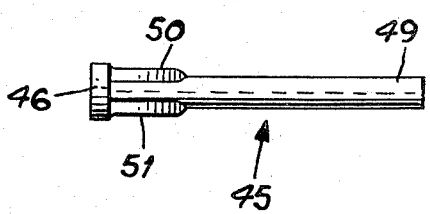
FIG. 6 is a plan view of the pin of FIG. 5.
FIG. 7 is an end view of FIG. 6 looking toward the head of the pin.

Pins 45 have a special configuration as shown in FIGS. 6 and 7 to prevent rotation thereof. Pin 45 includes a circular shaft 49 having a pair of oppositely extending radial projections 50 and 51 adjacent the head 46. Due to the projections 50 and 51 when the pin 45 is forced into block 20 by rotation of screw 48, the pin 45 cannot rotate since it bites into the smooth inner wall of aperture 44.

The advantage of the electrical switch assembly of this invention is that a fraction of the very valuable board space required by prior art switch assemblies is employed. The switch assembly may have random placement since this switch assembly is small in size. The switch assembly is also designed for assembly by automatic assembly equipment that could not be employed in the prior art switch assemblies. As pointed out in the description hereinabove, the same switch block and screws may be employed in either of two ways, thereby providing an arrangement that may be used several ways without modification.

While I have described above the principles of my invention in connection with specific apparatus it is to be clearly understood that this description is made only by way of example and not as a limitation to the scope of my invention as set forth in the objects thereof and in the accompanying claims.

I claim:
1. An electrical switch assembly for a printed circuit board comprising:
   a printed circuit board including
      a dielectric substrate, and
      a predetermined pattern of a plurality of conductors disposed on one surface of said substrate, a given number of said plurality of conductors each having a gap therein;
   a dielectric switch block disposed adjacent to a selected surface of said substrate; and
   a plurality of completely metallic screws each disposed adjacent a different one of said gaps and extending into said block, each of said plurality of screws having a head thereon that makes and breaks a connection across an associated one of said gaps when each of said plurality of screws is screwed in and out of said block.
2. An assembly according to claim 1, wherein
said printed board further includes
   a plurality of first apertures each extending through said substrate in different ones of said gaps;
said switch block is disposed on the other surface of said substrate and further includes
   at least a plurality of second apertures extending therethrough each in registry with a different one of said plurality of first apertures; and
said plurality of screws each extend through a different one of selected ones of said plurality of first apertures and threaded into registered ones of said plurality of second aperture, said heads making and breaking said connection by making and breaking contact with an associated one of said given number of said plurality of conductors adjacent both sides of an associated one of said gaps when each of said plurality of screws is screwed in and out of said plurality of first and second apertures.
3. An assembly according to claim 2, wherein
each of said plurality of first and second apertures has a smooth inner wall, and
each of said plurality of screws is a self-tapping screw capable of forming its own threads in an associated one of said smooth inner walls.
4. An assembly according to claim 2, wherein
each of said plurality of screws is stainless steel.
5. An assembly according to claim 1, wherein said printed circuit board further includes
   a plurality of first apertures each extending through an end of a different one of said given number of said plurality of conductors adjacent both sides of each of said gaps; and
   a plurality of second apertures each extending through said substrate in registry with a different one of said plurality of first apertures; and
said switch block is disposed in spaced relation with said one surface of said substrate and further includes
   a plurality of third apertures each extending through said switch block in registry with a dif- ferent one of said plurality of second apertures; and a plurality of completely metallic pins each having a shaft and a head thereon, each of said shafts extending through different ones of said registered first, second and third apertures with each of said shafts engaging an associated one of said given number of said plurality of conductors adjacent both sides of said gaps;

each of said plurality of screw heads making and breaking said connection by making and breaking contact between each of said screw heads and associated ones of said pin heads.

6. An assembly according to claim 5, wherein each of said plurality of first, second and third apertures has a smooth inner wall, and
each of said pins include
a circular shaft, and
a pair of oppositely extending radial projections having a given length extending from said circular shaft adjacent said head to engage an associated one of said smooth inner walls to prevent rotation of each of said pins.

7. An assembly according to claim 5, wherein said switch block further includes
a foot extending therefrom in perpendicular relation to said substrate and engaging said substrate to provide said spaced relation with said substrate.

8. An assembly according to claim 5, wherein each of said plurality of screws is stainless steel.

9. An assembly according to claim 1 wherein each of said plurality of screws is stainless steel.

* * * * *